US011222917B2

(12) United States Patent
Han et al.

(10) Patent No.: US 11,222,917 B2
(45) Date of Patent: Jan. 11, 2022

(54) BACKSIDE ILLUMINATED IMAGE SENSOR AND METHOD OF MANUFACTURING SAME

(71) Applicant: DB HiTek Co., Ltd., Seoul (KR)

(72) Inventors: Chang-Hun Han, Incheon-si (KR); Tae-Wook Kang, Yongin-si (KR)

(73) Assignee: DB HiTek Co., Ltd., Seoul (KR)

( * ) Notice: Subject to any disclaimer, the term of this patent is extended or adjusted under 35 U.S.C. 154(b) by 148 days.

(21) Appl. No.: 16/508,056

(22) Filed: Jul. 10, 2019

(65) Prior Publication Data

US 2020/0119062 A1 Apr. 16, 2020

(51) Int. Cl.
*H01L 27/146* (2006.01)
(52) U.S. Cl.
CPC .... *H01L 27/1464* (2013.01); *H01L 27/14621* (2013.01); *H01L 27/14683* (2013.01)
(58) Field of Classification Search
CPC ........... H01L 27/1464; H01L 27/14683; H01L 27/14621
See application file for complete search history.

(56) References Cited

U.S. PATENT DOCUMENTS 10,319,762 B2 * 6/2019 Han .................. H01L 27/14685
2017/0229497 A1 8/2017 Han

FOREIGN PATENT DOCUMENTS

KR 10-2017-0092911 A 8/2017

\* cited by examiner

*Primary Examiner* — Mark V Prenty
(74) *Attorney, Agent, or Firm* — Andrew D. Fortney; Central California IP Group, P.C.

(57) ABSTRACT

Disclosed is a backside illuminated image sensor and a method of manufacturing the same and, more particularly, a backside illuminated image sensor and a method of manufacturing the same, in which a height difference is between a pixel region and a surrounding region having a boundary between on an uppermost or back surface of a substrate, thereby eliminating one or more problems that occur when a thickness of a color filter in the pixel region is uneven.

12 Claims, 10 Drawing Sheets

BACKSIDE ILLUMINATED IMAGE SENSOR AND METHOD OF MANUFACTURING SAME

CROSS REFERENCE TO RELATED APPLICATION

The present application claims priority to Korean Patent Application No. 10-2018-0122525, filed Oct. 15, 2018, the entire contents of which are incorporated herein for all purposes by this reference.

BACKGROUND OF THE INVENTION

Field of the Invention

The present invention relates to a backside illuminated (e.g., back-illuminated) image sensor and a method of manufacturing the same and, more particularly, to a backside illuminated image sensor and a method of manufacturing the same in which the backside illuminated image sensor has a height difference between a pixel region and a surrounding region having a boundary therebetween on a substrate (e.g., an uppermost or back surface of the substrate), thereby eliminating one or more problems when the thickness of a color filter 50 in the pixel region is uneven.

Description of the Related Art

An image sensor is an apparatus for converting an optical image derived from a subject into an electrical signal. Among image sensors, the backside illuminated (e.g., back-illuminated) image sensor can have improved light receiving efficiency as compared with front side illuminated image sensors. The backside illuminated image sensor can be manufactured in such a manner that a wiring layer is formed on a (e.g., front surface) of a substrate, and a color filter layer and a micro lens layer or array are formed on a back surface of the substrate.

FIG. 1 is a schematic or plan view showing a shield portion layout, including a shield metal layer in a pixel region and a surrounding region of a general backside illuminated image sensor. FIG. 2 is a cross-sectional view taken along the line A-A' of the backside illuminated image sensor of FIG. 1. FIG. 3 is a schematic reference view of a spin coating apparatus performing a spin-coating process to form a color filter.

Hereinafter, the structure and problems of the backside illuminated image sensor in the related art will be described in detail with reference to the accompanying drawings.

Referring to FIGS. 1 and 2, a backside illuminated image sensor 9 in the related art includes a pixel region P and a surrounding region S. The pixel region P refers to a region that absorbs light incident from the outside to a back surface of a substrate 910. The surrounding region S refers to a light shielding region. In addition, the pixel region P and the surrounding region S are in contact with each other at the boundary or interface B.

Referring to FIGS. 1 and 2, the backside illuminated image sensor 9 has a pinning layer 920, a passivation layer (not identified), an interlayer insulating film 930, and a shield metal layer 940 on a back surface 913 of the substrate 910. In addition, the interlayer insulating film 930 and the shield metal 940 are planar and in a polygonal frame lattice pattern. For example, the interlayer insulating film 930 and the shield metal 940 may have a rectangular frame lattice pattern in the pixel region P and a square lattice pattern or a single plate shape in the surrounding region S, as shown in FIG. 1. Therefore, the pixel region P and the surrounding region S have a difference from each other in the pattern density, including the shield metal 940 in of the shield portion A.

Each unit pixel 951 is located in the inner space of the rectangular frame lattice within the surrounding region S.

The color filter 950 is formed in the process of making the unit pixels.

Referring to FIG. 3, the difference in the patterning density causes a striation failure in the color filter 950 in FIG. 2 during a spin coating process for forming the color filter 950. In detail, when forming the color filter 950, the substrate 910 on a vacuum chuck 960 are rotated together by a driving means, such as a motor. A liquid photoresist PR is dispensed substantially in the center of the substrate 910 from an overhanging dispenser 970, and thus spread radially on the substrate 910. In this case, due to the difference in the patterning density between the pixel region P and the surrounding region S, the PR residue remains in the boundary B or adjacent to the boundary B, which results in striation failure at the boundary B. Striation causes defects in the overall outer appearance of the image sensor, lowered sensitivity of the sensor, and the like.

In the process of forming the color filter 950, the PR solution fills a filter forming hole or space where the color filter would otherwise be formed in the surrounding region S adjacent to the boundary B. As a result, referring to FIG. 2, the color filter 950 in the related art gradually becomes higher or thicker adjacent to the boundary B. In other words, a height difference in the color filter 950 is formed due to non-uniformity of the thickness of the individual color filters between adjacent unit pixels 951. Also, a lens 955 on the color filter may have a different height or distance from the photodiode (not identified) from that of an adjacent lens.

This height difference also causes an overall sensitivity deterioration and the diffused reflection in the boundary B and/or the adjacent pixel region P, because the unit pixel 951 adjacent to the boundary B may be higher or thicker than the other unit pixels. This diffused reflection is one factor that deteriorates characteristics of the image sensor 9 in the related art.

To solve the above-described problems, the present invention relates to a backside illuminated or a back-illuminated image sensor in which a height of the uppermost or back surface of the substrate in the surrounding region is lower than that of the uppermost or back surface of the substrate in the pixel region, and a method of manufacturing the same. Alternatively, a thickness of the substrates in the surrounding region may be less than the thickness of the substrates in the pixel region, or the substrate is thinned or selectively or preferentially etched in the surrounding region relative to the pixel region.

SUMMARY OF THE INVENTION

Accordingly, the present invention has been made keeping in mind the above problems occurring in the prior art, and an object of the present invention is to provide a backside illuminated or back-illuminated image sensor and a method of manufacturing the same, in which the image sensor has a height difference between a pixel region and a surrounding region having a boundary therebetween. The image sensor may comprise a substrate having an uppermost or back surface, a laminated portion and a light shielding metal layer thereon, and more specifically, the uppermost or back surface of the image sensor in the pixel region is higher than the uppermost or back surface of the image sensor in the surrounding region, whereby a photoresist solution readily escapes from the boundary to the surrounding region S during a spin coating process that forms the color filter, thereby leaving no residue and/or solution at the boundary and/or adjacent to the boundary (e.g., in the surrounding region).

In addition, the present invention also provides a backside illuminated image sensor and a method of manufacturing the same that leave no residue at the boundary and/or adjacent to the boundary, thereby preventing striation (e.g., in the substrate) and not causing outer appearance defects or color shading due to the striation.

It is also an object of the present invention to provide a backside illuminated image sensor and a method of manufacturing the same, in which the color filter, which may have a height that continuously increases from the center of the pixel region towards the boundary with a surrounding region, has a thickness (e.g., in the vertical direction) in or among adjacent color pixels that is substantially uniform.

It is also an object of the present invention to provide a backside illuminated image sensor and a method of manufacturing the same, in which all unit pixels have substantially uniform thicknesses, thereby preventing deterioration in sensitivity even at the outside of the pixel region and adjacent to the boundary with the surrounding region.

In addition, the present invention provides a backside illuminated image sensor and a method of manufacturing the same, in which impurities such as boron are implanted into the lowermost or front surface or the substrate, or the lowermost or back surface of a second substrate, to introduce an etching rate difference between the pixel region and the surrounding region of the substrate during a thinning (e.g., wet etching) process, whereby a step or height/thickness difference can be formed on the uppermost or back surface of the substrate during the thinning or etching process.

It is also an object of the present invention to provide a backside illuminated image sensor and a method of manufacturing the same that contributes to convenience and/or suggests various methods of forming a step in the substrate, such as a method of forming a step on the uppermost or back surface of the substrate comprising a dry etching process.

In order to achieve the above-mentioned objects, the present invention can be implemented by the following embodiments.

According to various embodiments of the present invention, a backside illuminated image sensor according to the present invention includes a substrate having a lowermost or front surface, an uppermost or back surface, and a plurality of conversion elements therein, lamination having one or more layers on the uppermost or back surface of the substrate, a light shielding metal layer on the lamination, configured to shield incident light (e.g., from one or more lenses), a color filter on the lamination in a pixel region of the image sensor, the pixel region comprising a plurality of unit pixels, and a plurality of lenses on the color filter, configured to focus incident light on one of the plurality of conversion elements in a corresponding pixel, wherein the uppermost or back surface of the substrate has a height difference between the pixel region and a surrounding region. The pixel and surrounding regions may have a boundary therebetween.

According to other or further embodiments of the present invention, the uppermost or back surface of the substrate in the backside illuminated image sensor may include a first flat portion having a first height, that is substantially flat and/or horizontal in the pixel region, and a step having a second height different from the first height. The step may include a sloped region that declines from the boundary to the surrounding region.

According to other or further embodiments of the present invention, the lamination and the light shielding metal layer in the backside illuminated image sensor may have a substantially constant thickness from the pixel region to the surrounding region (e.g., in the pixel region and the surrounding region).

According to still other or still further embodiments of the present invention, the light shielding metal layer in the backside illuminated image sensor may include a planar first light shielding portion in a rectangular frame, lattice and/or pattern in the pixel region, and a second light shielding portion in a rectangular lattice and/or pattern, or having a plate shape in the surrounding region. Optionally, the second light shielding portion has an inside that is filled. Consequently, there may be a difference in patterning density between the pixel region and the surrounding region.

According to other or further embodiments of the present invention, the uppermost or back surface of the substrate in the pixel region may be higher than the uppermost or back surface of the substrate in the surrounding region.

According to still other or still further embodiments of the present invention, the lamination in the backside illuminated image sensor may include a pinning layer on the uppermost or back surface of the substrate, the pinning layer being configured to provide a charge accumulation region on or in the uppermost surface, and a first passivation layer on the pinning layer, the first passivation layer being configured to protect a surface (e.g., the uppermost or back surface) of the substrate.

According to other or further embodiments of the present invention, in the backside illuminated image sensor, the lamination and the second light shielding portion in the surrounding region may be lower than the lamination and the first light shielding portion in the pixel region.

According to various embodiments of the present invention, a backside illuminated image sensor may include a substrate having a lowermost or front surface, an uppermost or back surface, and a plurality of conversion elements therein, lamination comprising one or more layers on the uppermost or back surface of the substrate, a light shielding metal layer on the lamination, configured to shield incident light (e.g., from one or more lenses) and having a planar shape in a rectangular frame, lattice and/or pattern in a pixel region, a color filter on the lamination in the pixel region, the pixel region including a plurality of unit pixels, in which the color filter may fill an inside of a filter forming hole in or from an uppermost layer in the pixel region other than a plurality of lenses, and the plurality of lenses on the color filter focus incident light on one of the plurality of conversion elements in a corresponding pixel, wherein the uppermost surface of the image sensor in a surrounding region is lower than the uppermost surface of the image sensor in the pixel region.

According to other or further embodiments of the present invention, the uppermost or back surface of the substrate in the backside illuminated image sensor may have a height difference between the pixel region and the surrounding region. A boundary may be between the pixel region and the surrounding region.

According to still other or still further embodiments of the present invention, the light shielding metal layer in the backside illuminated image sensor may have a difference in patterning density between the pixel region and the surrounding region.

According to other or further embodiments of the present invention, the uppermost or back surface of a first substrate in the backside illuminated image sensor may be formed by implanting boron (or another ion, such as phosphorous) into a lowermost or front surface of the first substrate or a lowermost or back surface of a second substrate bonded to the first substrate in the surrounding region, then wet etching at least the implanted area(s) (e.g., the surrounding region).

According to other or still further embodiments of the present invention, in the backside illuminated image sensor, the pixel region may have a height different from that of the surrounding region as a result of the wet etching, after implanting boron (e.g., B-11) into the lowermost or front surface of the first substrate or the lowermost or back surface of the second substrate at a concentration or dose of $1 \times 10^{17}/cm^3$ or more.

According to other embodiments of the present invention, the lamination in the backside illuminated image sensor may include a pinning layer on the uppermost or back surface of the substrate, the pinning layer being configured to provide a charge accumulation region on or in the uppermost or back surface of the substrate, and a first passivation layer on the pinning layer, the first passivation layer being configured to protect a surface (e.g., the uppermost or back surface) of the substrate.

According to embodiments of the present invention, a method of manufacturing a backside illuminated image sensor includes implanting impurities into an uppermost or front surface of a second substrate in a surrounding region, bonding a first substrate to the uppermost or front surface of the second substrate, thinning a lowermost or back surface of the second substrate so that an uppermost or back surface of the first substrate in a corresponding surrounding region is lower than an uppermost or back surface of the first substrate in a pixel region, the pixel region of the surrounding region of the first substrate having a boundary therebetween, depositing lamination on the uppermost or back surface of the first substrate, forming a light shielding metal layer on the lamination, forming a plurality of filter forming holes in an upper surface of the light shielding metal layer in the pixel region, forming a color filter in the filter forming holes, and forming a plurality of lenses on an upper surface of the color filter.

According to other embodiments of the present invention, in the method of manufacturing the backside illuminated image sensor, the impurities may comprise boron (e.g., B-11), phosphorous, etc.

According to other or further embodiments of the present invention, in the method of manufacturing the backside illuminated image sensor, the impurities may be implanted into a lowermost or front surface in the surrounding region of the substrate at a concentration or dose of $1 \times 10^{17}/cm^3$ or more.

According to still other or still further embodiments of the present invention, in the method of manufacturing the backside illuminated image sensor, the lamination and the light shielding metal layer in the surrounding region may be lower than the lamination and the light shielding metal layer in the pixel region.

According to embodiments of the present invention, a method of manufacturing a backside illuminated image sensor may include bonding a first substrate to an uppermost or front surface of a second substrate; forming a plurality of conversion elements in the first substrate, implanting boron (or another impurity) into a lowermost or back surface of the second substrate in a surrounding region; thinning the lowermost or back surface of the second substrate so that an uppermost or back surface of the first substrate in a surrounding region lower than the uppermost or back surface of the first substrate in a pixel region, the pixel region and the surrounding region of the first substrate having a boundary therebetween, forming lamination on the uppermost or back surface of the first substrate, forming a light shielding metal layer on the lamination, forming a plurality of filter forming holes in an upper surface of the light shielding metal layer in the pixel region, forming a color filter in the filter forming holes via a spin coating process, and forming a plurality of lenses on an upper surface of the color filter.

According to embodiments of the present invention, a method of manufacturing a backside illuminated image sensor may include bonding a first substrate to an uppermost or front surface of a second substrate, forming a plurality of conversion elements in the first substrate, thinning a lowermost or back surface of the second substrate, forming an uppermost or back surface of the first substrate in a surrounding region lower than the uppermost surface of the first substrate in a pixel region (e.g., reducing a height of the uppermost or back surface of the first substrate in the surrounding region relative to the pixel region), the pixel region and the surrounding region of the first substrate having a boundary therebetween, forming lamination on the uppermost or back surface of the first substrate, forming a light shielding metal layer on the lamination, forming a plurality of filter forming holes in an upper surface of the light shielding metal layer in the pixel region, forming a color filter in the filter forming holes, and forming a plurality of lenses on an upper surface of the color filter.

According to other embodiments of the present invention, in the method(s) of manufacturing the backside illuminated image sensor, forming the uppermost or back surface of the first substrate in the surrounding region lower than the uppermost or back surface of the first substrate in the pixel region may include applying a photoresist film on an uppermost or front surface of the second substrate in the pixel region, and dry etching the lowermost or back surface of the second substrate in the surrounding region. The method(s) may further comprise exposing the lowermost or back surface of the second substrate.

The present invention has the following effects with the above-described configuration(s).

The present invention introduces a height difference between the pixel region and the surrounding region, the pixel region and the surrounding region having a boundary therebetween, on an uppermost or back surface of a substrate having lamination and a light shielding metal layer thereon, and more specifically, the uppermost surface of the image sensor in the pixel region higher than the uppermost surface of the image sensor in the surrounding region, whereby a photoresist solution readily escapes from the boundary to the surrounding region during a spin coating process that forms the color filter, thereby leaving no residue and/or solution at the boundary and/or adjacent to the boundary (e.g., in the surrounding region).

In addition, the present invention has an advantage in that no residue is left at the boundary and/or adjacent to the boundary, thereby preventing striation in or on the substrate, and not causing outer appearance defects or color shading due to the striation.

In addition, the present invention has an advantage in that the color filter, which may have a height that continuously increase from the center of the pixel region towards the boundary with a surrounding region, has a thickness (e.g., in the vertical direction) in and among adjacent color pixels that substantially uniform.

In addition, the present invention has an advantage that all unit pixels have with substantially uniform thicknesses, thereby preventing deterioration in sensitivity, even at the outside of the pixel region, adjacent to the boundary.

In addition, the present invention has an advantage that impurities such as boron are can be implanted into the lowermost or front surface of the first substrate or the lowermost or back surface of a second substrate to cause a difference in the etching rate of the substrate between in the pixel region and the surrounding region of the substrate during a wet etching process, whereby a step can be formed on the uppermost or back surface of the substrate during the process.

In addition, the present invention can contribute to convenience by suggesting various methods of forming a step, such as a method of forming a step on the uppermost or back surface of a substrate, using a dry etching process.

On the other hand, even if the effects are not explicitly mentioned here, the effects described in the following specification, which are expected by the technical characteristics of the present invention, and the provisional effects thereof are considered to be described in the specification of the present invention.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, embodiments of the present invention will be described in detail with reference to the accompanying drawings. Embodiments of the present invention can be modified in various forms, and the scope of the present invention should not be interpreted as being limited to the following embodiments, but should be interpreted based on the claims. Further, the embodiments herein are provided as a reference for more fully illustrating the present invention to those skilled in the art.

In the following description, an element that is "on", on the "top" of, "upper", or "above" another element refers to a concept including both the element being placed in contact with the upper surface of another element and the element being a certain distance from the other element. In the case where element is a certain distance from the other element, a third element may be between the element and the other element. Further, when one element is "directly on the other element" or "just above the other element", a third element can be between the one element and the other element.

In addition, it should be noted that although "first" and "second" components are described below, the "second" component is not intended to be a premise of "first" component, but is for the sake of explanation.

On the other hand, when otherwise feasible, the functions or operations specified in a particular block, order or sequence may occur in a different order or sequence than those described herein. For example, the functions or operations of two consecutive blocks or steps may be performed substantially simultaneously, or may be performed in reverse.

Figure 1:
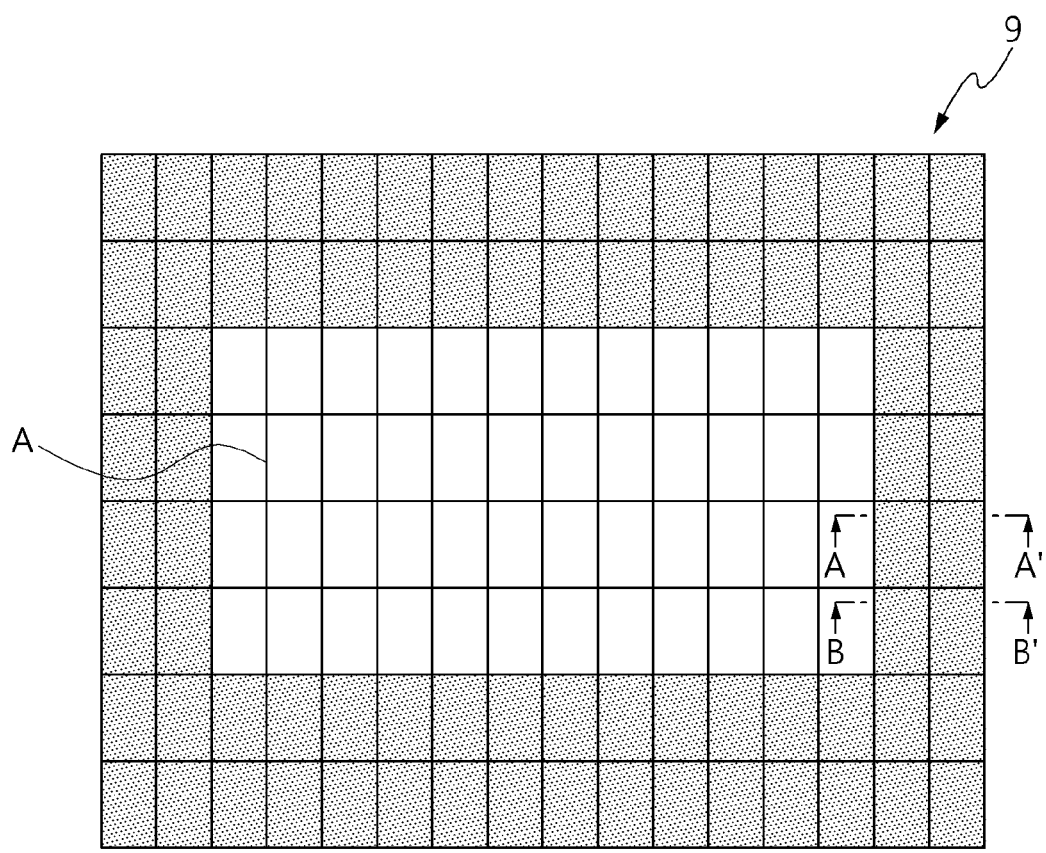
FIG. 1 is a schematic and/or plan view showing a layout of a shield portion in a pixel region and a surrounding region of a general back-illuminated image sensor.
Figure 4:
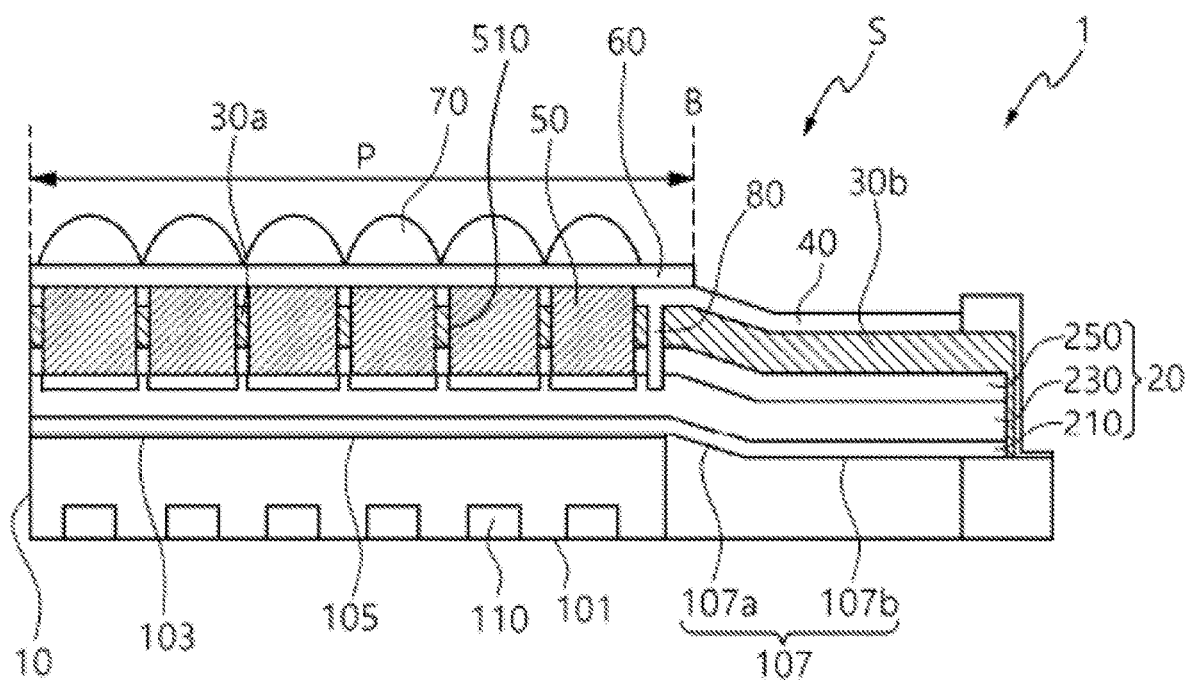
FIG. 4 is a cross-sectional view taken along the line B-B' of a backside illuminated image sensor according to various embodiments of the present invention.

FIG. 4 is a cross-sectional view taken along the line B-B' in FIG. 1 of a backside illuminated image sensor according to various embodiments of the present invention.

Hereinafter, a backside illuminated image sensor 1 according to various embodiments of the present invention will be described in detail with reference to the accompanying drawings.

Referring to FIG. 4, the backside illuminated image sensor 1 according to the present invention includes a pixel region P and a surrounding region S. As described above, the pixel region P is a region that absorbs external incident light (e.g., in conversion elements 110), and the surrounding region S refers to a region that shields the incident light to protect a circuit therein. There is also a boundary B where the pixel region P and the surrounding region S contact each other.

The present invention relates to a backside illuminated image sensor 1 and a method of manufacturing the same and, more particularly, to a backside illuminated image sensor and a method of manufacturing the same in which the pixel region P and the surrounding region S have a height difference, thereby eliminating one or more problems resulting from a color filter 50 having an uneven thickness. Accordingly, it is possible to prevent irregular reflection(s) in the pixel region P adjacent to the boundary B. Thus, deterioration of or in the overall characteristics of the image sensor 1 may be prevented. The details thereof will be described later.

The backside illuminated image sensor 1 includes the substrate 10, lamination 20, a light shielding metal layer 30*a-b*, an upper insulating layer 40, a color filter 50, a planarization layer (PL) 60, a plurality of lenses 70, and an element isolation film 80. Hereinafter, the shield portion A of the image sensor substrate (FIG. 1) may be a region that includes the light shielding metal layer 30*a-b*. The shield portion A may further include the lamination 20 and the upper insulating layer 40.

First, the substrate 10 may be or comprise an epitaxial substrate, a crystalline silicon substrate, a bulk substrate, or the like. The pixel region P of the substrate 10 may include one or more conversion elements 110 and one or more transistors (not shown) electrically connected to the conversion elements 110. The substrate 10 has a lowermost or front surface 101 and an uppermost or back surface 103. The lamination 20, the light shielding metal layer 30a-b, and the upper insulating layer 40 are on the uppermost or back surface 103. In addition, the substrate 10 has an insulating film (not shown) on the uppermost or back surface 103 thereof and one or more circuits or circuit structures (not shown) therein.

The uppermost or back surface 103 of the substrate 10 has a first flat portion 105 that is substantially flat or planar, in the pixel region P. In addition, the uppermost surface 103 of the substrate 10 has a step 107 that has a height different from that of the first flat portion 105. The boundary B is between or at the interface of the first flat portion 105 and the step 107, the step 107 being in the surrounding region S. More specifically, the step 107 of the substrate 10 has an inclined portion 107a. The inclined portion 107a inclines at a predetermined angle or degree from the first flat portion 105 to a second flat portion 107b that is substantially flat and horizontal (e.g., from the end of the inclined portion 107a, in a direction away from the pixel region P). However, such a shape or cross-sectional profile is merely an example, and the uppermost or back surface 103 in the pixel region P of the substrate 10 may simply be higher than the uppermost or back surface 103 in the surrounding region S.

Accordingly, the height of the uppermost or back surface 103 in the surrounding region S is lower than the height of the uppermost or back surface 103 in the pixel region P, so that the lamination 20, the light shielding metal layer 30a-b, and/or the upper insulating layer 40 on the uppermost or back surface 103 of the substrate in the surrounding region S may be lower than the corresponding layers on the uppermost or back surface 103 in the pixel region P. A method of forming the uppermost or back surface 103 of the substrate having the structure as described above will be described in detail later.

The conversion element 110 is or comprises a photoelectric conversion element that produces a charge in response to incident light. The conversion element 110 may be or comprise a photodiode (PD), but is not limited thereto.

The lamination 20 may include one or more layers on the uppermost or back surface 103 of the substrate 10, such as a pinning layer 210, a first passivation layer 230, and an insulating film 250.

The pinning layer 210 is on the uppermost or back surface 103 in the pixel region P and the surrounding region S of the substrate 10 and may form a charge accumulation region in or on the uppermost or back surface 103. The pinning layer 210 may include zirconium oxide, hafnium silicon oxide, hafnium silicon oxynitride, silicon nitride, and the like.

The first passivation layer 230 is on the pinning layer 210 in the pixel region P and the surrounding region S, and may serve as a protective layer that protects the surface 103 of the substrate 10. The first passivation layer 230 may be or comprise a nitride film, such as SiN or the like. Specifically, the first passivation layer 230 may protect the substrate 10 during a subsequent patterning process.

The insulating film 250 (which may be an interlayer insulating film) is on the first passivation layer 230. The light shielding metal layer 30a-b, which will be described later, may be on the insulating film 250 in a predetermined or specific pattern. Also, the insulating film 250 preferably has a light scattering or anti-reflection function. The insulating film 250 may be or comprise a lamination film, an oxide film (e.g., silicon dioxide) and a nitride film (e.g., silicon nitride) in any order or sequence, an oxide film and a carbon-containing film such as SiC in any order or sequence, but is not limited thereto. The insulating film 250 in the pixel region P may have substantially the same pattern as the light shielding metal layer 30a in and/or between a plurality of unit pixels 510, to be described in further detail later.

The light shielding metal layer 30a-b is on the lamination 20 (for example, the insulating film 250), so as to shield incident light from the lenses 70, to be described in further detail later. In addition, the light shielding metal layer 30a-b may be or comprise one or more metals, such as aluminum (Al), tungsten (W), or copper (Cu), but the scope of the present invention is not limited to these particular examples. The light shielding metal layer 30a-b may include a first light shielding portion 30a and a second light shielding portion 30b.

The first light shielding portion 30a is in the space between adjacent unit pixels 510 in the pixel region P to prevent data mixing between the adjacent unit pixels 510. For example, the incident light from the lenses 70, to be described in further detail later, may pass through the upper insulating layer 40 and then into the adjacent unit pixel 510. In this case, crosstalk occurs between the unit pixels 510 adjacent to each other. Therefore, the first light shielding portion 30a may be at the boundaries between adjacent unit pixels 510 to prevent crosstalk between the adjacent unit pixels 510.

The second light shielding portion 30b is in the surrounding region S to prevent the incident light from being transmitted to the substrate 10, thereby protecting the internal circuitry. The second light shielding portion 30b may be lower than the first light shielding portion 30a.

The upper insulating layer 40 is on an uppermost portion of the light shielding metal layer 30a-b and is in the surrounding region S and the pixel region P. The upper insulating layer 40 may be or comprise a silicon oxide film or a silicon oxynitride film, but the scope of the present invention is not limited thereto. The upper insulating layer 40, like the light shielding metal layer 30a-b, is in the pixel region P and the surrounding region S. The upper insulating layer 40 is on the first light shielding portion 30a and has substantially the same pattern as the first light shielding portion 30a in the pixel region P.

The lamination 20, the light shielding metal layer 30a-b, and the upper insulating layer 40 may have substantially the same shape as the uppermost or back surface 103 of the substrate 100, so that a height difference occurs between the pixel region P and the surrounding region S. For example, all the configurations (e.g., of the lamination 20, the light shielding metal layer 30a, and the upper insulating layer 40 are substantially flat or planar in the pixel region P, then decline at a predetermined angle from the boundary B towards the surrounding region S over a predetermined distance, and then become flat and/or planar in the surrounding region S away from the pixel region P. Each of the lamination 20, the light shielding metal layer 30a-b, and the upper insulating layer 40 may have a substantially constant thickness throughout.

The color filter 50 is on the insulating film 250 in the pixel region P. The color filter 50 filters wavelengths of light other than the corresponding color (e.g., red [R], green [G], or blue [B]) for the unit pixel 50 from the incident light from the corresponding lens 70, and the selected color is incident on the conversion element 110 of the corresponding unit pixel. More specifically, the pixel region P includes a plurality of unit pixels 510, and each unit pixel 510 is a predetermined distance from the adjacent unit pixel(s). The unit pixels 510 include a red pixel R configured to generate photo charge corresponding to incident light in a red spectral region, a green pixel G configured to generate photo charge corresponding to incident light in a green spectral region, and a blue pixel B configured to generate photo charge corresponding to the incident light of the blue spectrum region.

The planarization layer PL 60 is on the color filter 50 for planarization (e.g., to provide a uniform pixel height and focal length for each of the plurality of lenses 70). The lenses 70 are on the planarization layer 60. For example, the planarization layer 60 is on the color filter 50 and below the plurality of lenses 70 in the pixel region P, and extends throughout the pixel region P to or approximately to the boundary B.

The lenses 70 comprise a plurality of micro lenses on the color filter 50 that are configured to focus the incident light on the conversion element 110 in the corresponding pixel. Each unit pixel incudes one (or a corresponding one) of the conversion elements.

An element isolation film 80 vertically crosses the upper insulating layer 40 through the lamination 20 or part of the lamination 20. The element isolation film 80 defines the pixel region. Therefore, the element isolation film 80 is at the boundary B or adjacent to the boundary B. The element isolation film 80 may be formed by a shallow trench isolation (STI) process.

Hereinafter, the advantages obtained by forming the first flat portion 105 and the step 107 on the uppermost or back surface 103 of the substrate 100 will be described in detail.

Figure 2:
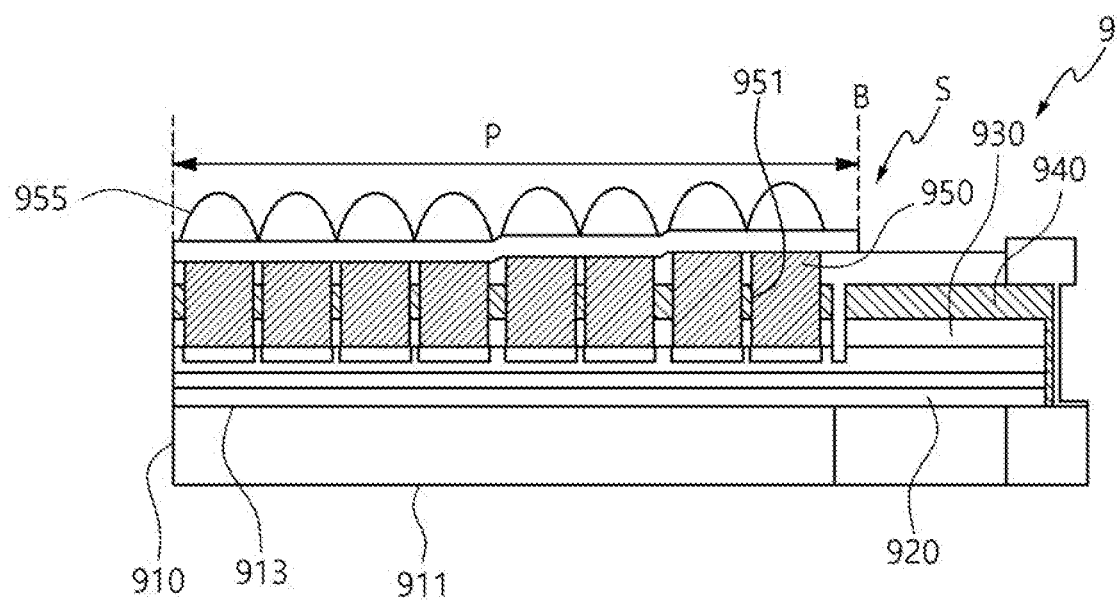
FIG. 2 is a cross-sectional view taken along the line A-A' of a backside illuminated image sensor in the related art.

Referring to FIG. 1, the problems occurring in the image sensor 9 in the related art will be described in detail once again. In the pixel region P, a planar shield portion or region A is in a rectangular frame, lattice or pattern, and may include or be between the unit pixels 951 (FIG. 2). In addition, in the surrounding region S (FIG. 2), the shield portion A may have a rectangular lattice or plate shape and may include or be filled with a photoresist or photoresist solution. Therefore, the shield portion A may have a patterning density in the pixel region P from that in the surrounding region S.

Figure 3:
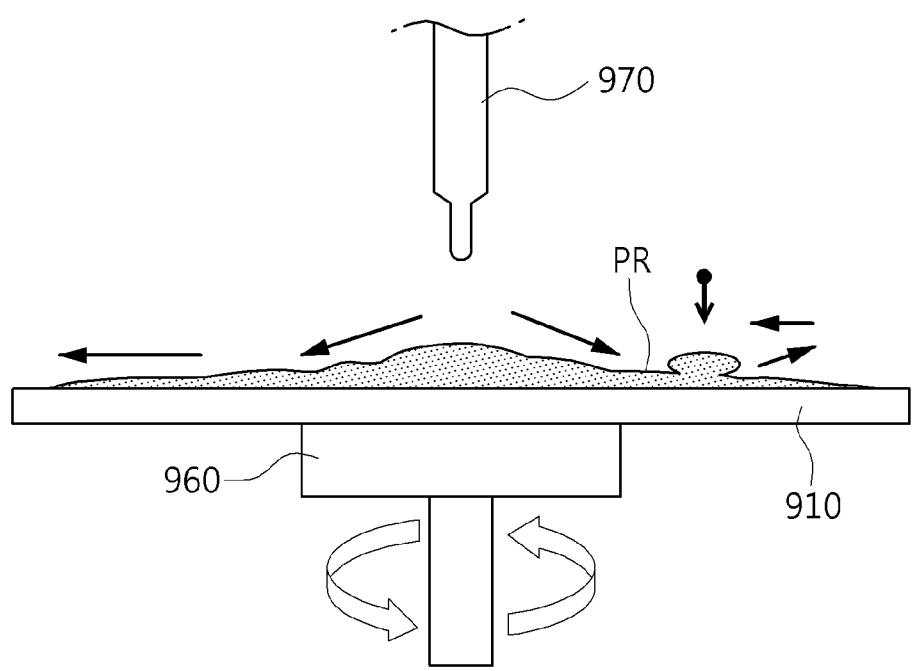
FIG. 3 is a schematic or reference view illustrating an exemplary spin coating apparatus for performing a process for forming a color filter.

Referring to FIG. 3, due to this difference in the patterning density, striation failures may be caused in the color filter 950 during a spin coating process for forming the color filter 950. In detail, when forming the color filter 950, the substrate 910 fixed to the top of a vacuum chuck 960 is rotated together with the vacuum chuck 960 by a driving means, such as a motor. A liquid photoresist PR is dispensed on the center of the substrate 910 from a dispenser 970 above the substrate 910, and thus is spread radially on the top surface of the substrate 910. In this case, due to the difference in patterning density between the pixel region P and the surrounding region S, the PR residue remains at the boundary B or adjacent to the boundary B, which results in striation failure in or at the boundary B. The striation may cause defects in the overall outer appearance, decreased sensitivity of the sensor, and the like.

In the process of forming the color filter 950, the PR solution fills the filter forming holes (e.g., spaces where individual color filters 950 are formed) and covers the uppermost portion of the surrounding region S adjacent to the boundary B. As a result, referring to FIG. 2, the color filter 950 on the substrate 910 of the image sensor 9 in the related art gradually increases in height or thickness from the center of the pixel region P to the boundary B. In other words, a height difference may be formed between adjacent unit pixels 951 due to non-uniformity in the thickness of the color filter 950 during the spin-coating process. Also, the lenses 955 on the color filter 950 may have a height or focal length difference from the adjacent lens.

This height difference may also cause overall sensitivity deterioration, as well as diffused reflection(s) in or at the boundary B of the pixel region P, because the unit pixel 951 adjacent to the boundary B is higher than the other unit pixels. This diffused reflection is one factor that deteriorates the characteristics of the image sensor 9 in the related art.

To solve such a problem, the image sensor 1 according to embodiments of the present invention is provided such that the height of an uppermost or back surface 103 in the surrounding region S is lower than the height of the uppermost or back surface 103 in the pixel region P, thereby reducing or eliminating the problems occurring in the image sensor 9 in the related art described above.

First, when spin coating is performed to form the color filter 50, the PR solution does not remain at or on the boundary B, but easily escapes from the boundary B in a direction away from the pixel region P through, for example, the declined portion 107a. Accordingly, no striation occurs, and the possibility that the PR solution may flow to an adjacent filter forming hole (not shown) may decrease remarkably. As a result, it is possible to ensure that the total thickness of adjacent unit pixels 510 is uniform from the center of the pixel region P to the boundary B.

Therefore, the image sensor 1 according to embodiments of the present invention may solve the problems of overall appearance defects, sensitivity deterioration, and the like that occur in the backside illuminated image sensor 9 in the related art.

To solve such problems, in the image sensor 1 according to embodiments of the present invention, the uppermost layer of the pixel region P (not including the planarization layer 60 and the lenses 70) is higher than the uppermost layer of the surrounding region S. Thus, the same film or functional material in the surrounding region S may be lower than in the pixel region P.

FIGS. 5A to 5D are reference views illustrating structures made during an exemplary method of manufacturing a backside illuminated image sensor according to embodiments of the present invention.

Hereinafter, methods of manufacturing a backside illuminated image sensor according to the present invention will be described in detail with reference to the accompanying drawings.

Figure 5A:
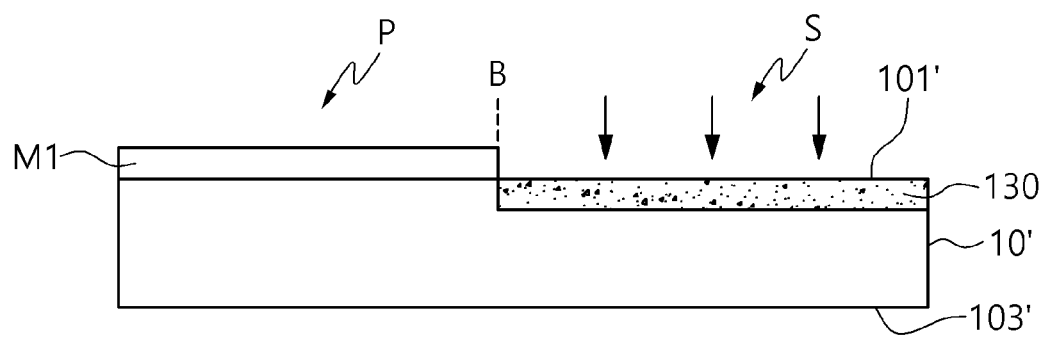
FIGS. 5A to 5D are reference views illustrating intermediate structures formed during an exemplary method of manufacturing a backside illuminated image sensor according to various embodiments of the present invention.

Referring to FIG. 5A, a method of manufacturing a backside illuminated image sensor according to embodiments of the present invention includes a step of implanting impurities such as boron B into an uppermost or front surface 101' in a surrounding region S of a second substrate 10'. Generally, during a process for thinning the substrate 10', the etching rate of silicon (Si) in the second substrate 10' may depend on the concentration of boron or other in impurity or dopant in the surrounding regions of the substrate 10'. For example, when boron is present in the substrate at a concentration of $1 \times 10^{17}/cm^3$ or more, but is present at a lower concentration in the pixel region P, the surrounding region S is etched faster than the pixel region P during wet etching, so that a height difference arises between on the uppermost or back surface 103 or in the boundary B of the substrate. The boron may comprise the isotope B-11 (e.g., 6 neutrons and 5 protons). In addition, boron can be implanted into on the surrounding region S at a concentration of $1 \times 10^{17}/cm^3$ or more, and more preferably between $4 \times 10^{17}/cm^3$ and $10 \times 10^{17}/cm^3$. It should be understood, however, that the scope of the present invention is not limited to the above-described numerical ranges, which are merely illustrative. The ion implantation method is performed by forming a mask pattern M1 on the uppermost or front surface 101' in the pixel region P of the second substrate 10', and then implanting the impurities 130 into the uppermost or front surface 101' in the exposed surrounding region S.

Figure 5B:
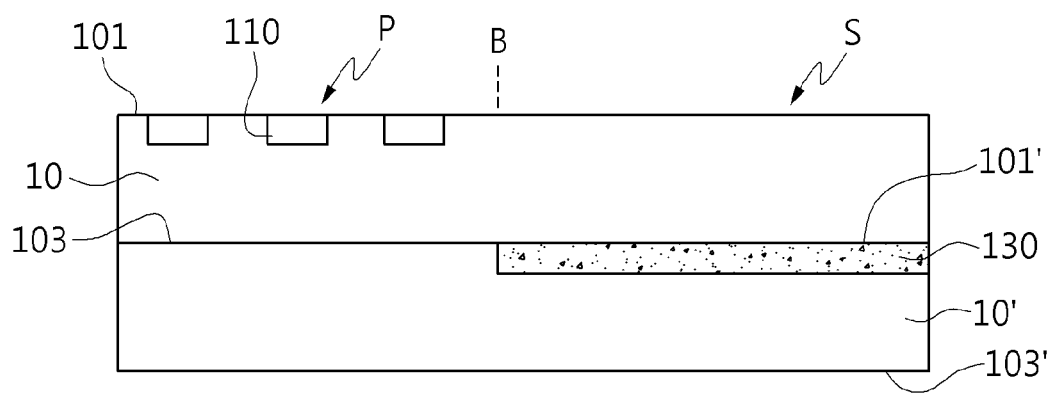

Referring to FIG. 5B, the first substrate 10 is bonded (e.g., by wafer bonding) to the uppermost or front surface 101' of the second substrate 10'. The first substrate 10 and the second substrate 10' have different impurity-doping concentrations, at least in certain regions. A plurality of conversion elements 110 are in the pixel region P of the first substrate 10, and each may be or comprise a photodiode PD.

Figure 5C:
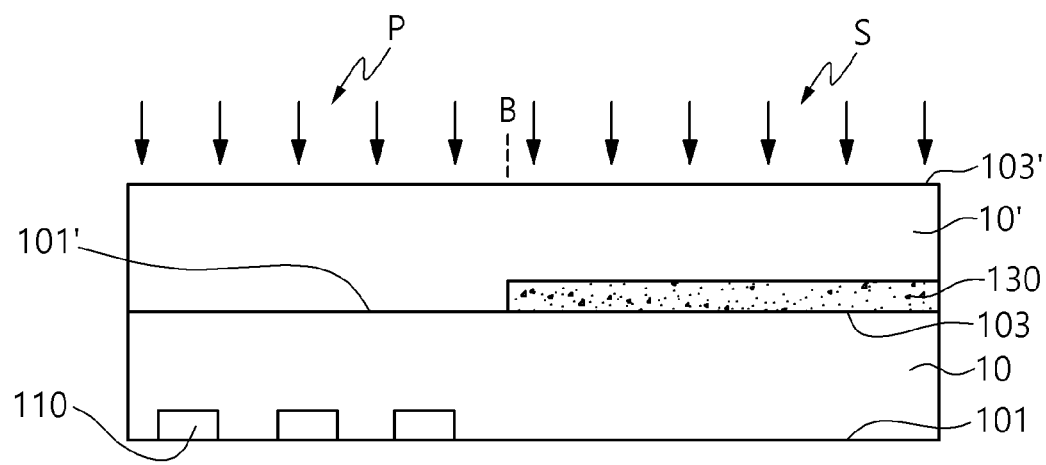
Figure 5D:
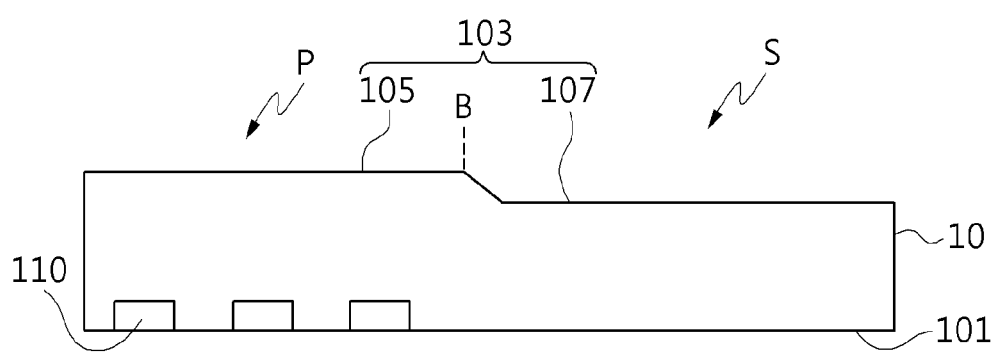

Referring to FIG. 5C, a thinning process is performed on the lowermost or back surface 103' of the second substrate 10'. The thinning process may be or comprise a wet etching process, a polishing or grinding process (e.g., chemical-mechanical polishing), etc. In the wet etching process, the part of the surrounding region S of the second substrate 10' containing the impurities 130 has a faster etching rate than the pixel region P. Accordingly, referring to FIG. 5D, the uppermost or back surface 103 of the first substrate 10 has a first flat portion 105 in the pixel region P that is substantially flat and/or planar, and a step 107 in the surrounding region S, having a different height than the first flat portion 105. More specifically, the step 107 includes a declined portion 107a that declines at a predetermined angle and/or over a predetermined distance from the boundary B to the surrounding region S and a second flat portion 107b that is substantially flat and/or planar from the end of the first flat portion 107a in a direction away from the pixel region P.

Figure 8:
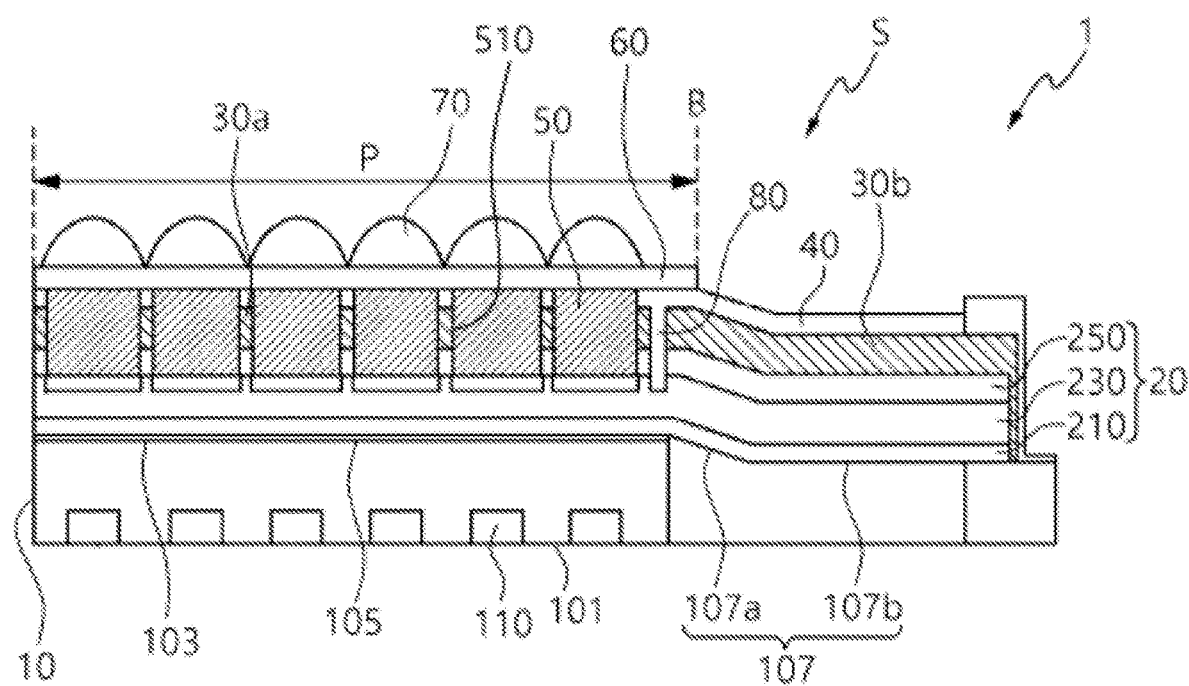
FIG. 8 is a cross-sectional view taken along the line B-B' of the exemplary image sensor in FIG. 1 by the process according to FIGS. 5A to 7B.

Referring to FIG. 8, a pinning layer 210 is on the uppermost or back surface 103 of the substrate 10, a first passivation layer 230 is on the pinning layer 210, an oxide layer 250 is on the first passivation layer 230, and a light shielding metal layer 30a-b is on the oxide film 250. The pinning layer 210, the first passivation layer 230, and the light shielding metal layer 30a-b have a constant thickness substantially along the uppermost or back surface of the substrate 10 (e.g., in a longitudinal/horizontal direction). One object of the present invention is difficult to achieve when the above-described layers gradually increase in thickness in an outward direction towards the surrounding region S. The light shielding metal layer 30a-b may be or comprise a metal, such as aluminum (Al), tungsten (W), copper (Cu), or the like, and is not limited thereto.

The light shielding metal layer 30a-b may have a rectangular frame, lattice and/or pattern in the pixel region P and a rectangular lattice or pattern or a plate form (e.g., continuous or with the inside thereof filled) in the surrounding region S. On the light shielding metal layer 30a-b, an upper insulating layer 40 may be deposited and patterned in substantially the same way as the light shielding metal layer 30a-b.

After filter forming holes or trenches 530 are formed in the pixel region P, a color filter 50 is formed in the filter forming hole 530, a planarization layer 60 is formed on the color filter 50, and a plurality of lenses 70 are formed on the upper side of the planarization layer 60. The configuration(s) shown in FIG. 8 may be formed using any method known or to be known. As described above, the color filter 50 may be formed using a spin coating process. The filter forming holes may extend from the uppermost layer (e.g., below the planarization layer 60) to a certain depth. For example, the filter forming holes may extend from the upper insulating layer 40 to the upper surface of the first passivation layer 230 (or the interface thereof with the pinning layer 210) of the lamination 20 in the pixel region P, but the scope of the present invention is not limited thereto.

FIGS. 6A to 6D are reference views illustrating structures formed in an exemplary method of manufacturing a backside illuminated image sensor according to other embodiments of the present invention.

The method of manufacturing a backside illuminated image sensor according to other embodiments of the present invention is different from the method of manufacturing the backside illuminated image sensor according to the embodiments above-described with regard to FIGS. 5A-D in the order and manner of the impurity implantation process.

Figure 6A:
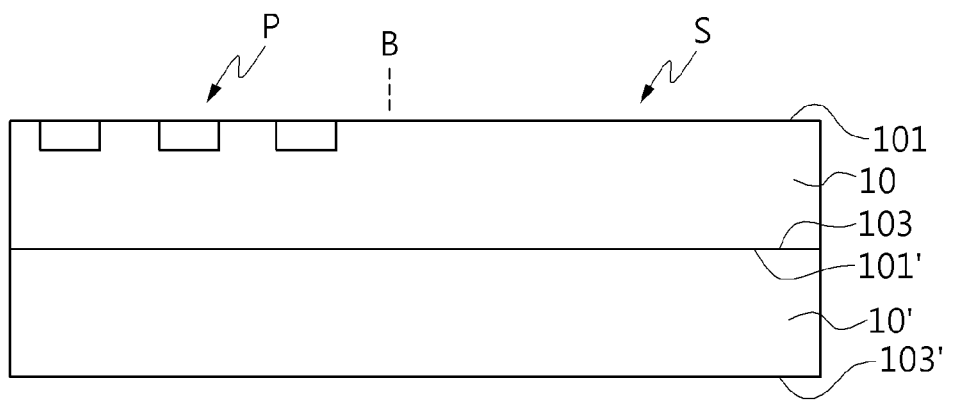
FIGS. 6A to 6D are reference views illustrating intermediate structures formed during an exemplary method of manufacturing a backside illuminated image sensor according to other embodiments of the present invention.

Referring to FIG. 6A, a wafer bonding process is performed so that a first substrate 10 is on an uppermost or front surface 101' of a second substrate 10'. The conversion elements 110 are in the pixel region P of the first substrate 10. For example, each of the conversion elements 110 may be or comprise a photodiode PD.

Figure 6B:
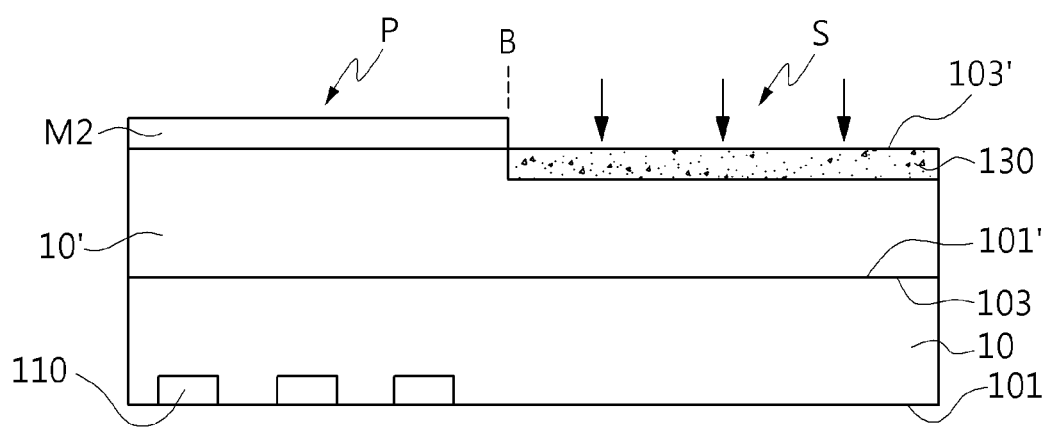
Figure 6C:
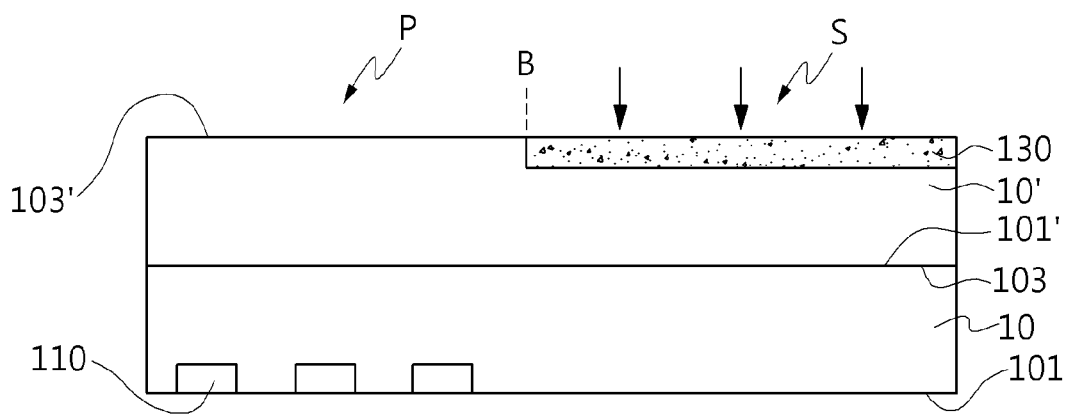
Figure 6D:
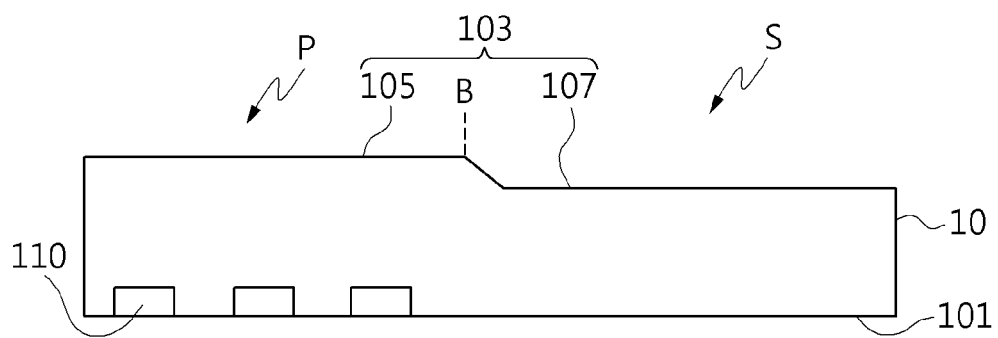

Subsequently, referring to FIG. 6B, the impurities 130 are implanted into the lowermost or back surface 103' of the second substrate 10'. For example, the impurities may comprise boron or phosphorous. The ion implantation method is performed by forming a mask pattern M2 on the lowermost or back surface 103' in the pixel region P of the second substrate 10', and then implanting the impurities 130 into the uppermost or front surface 101' in the exposed surrounding region S. The impurity implantation concentration may be the same as described above. Then, referring to FIG. 6C, the thinning process is performed on the lowermost or back surface 103' of the second substrate 10'. As a result, as shown in FIG. 6D, a step 107 is formed on the uppermost or back surface 103 of the first substrate 10. The remaining or subsequent steps may be the same as the manufacturing method described above with regard to FIGS. 5A-D.

Figure 7A:
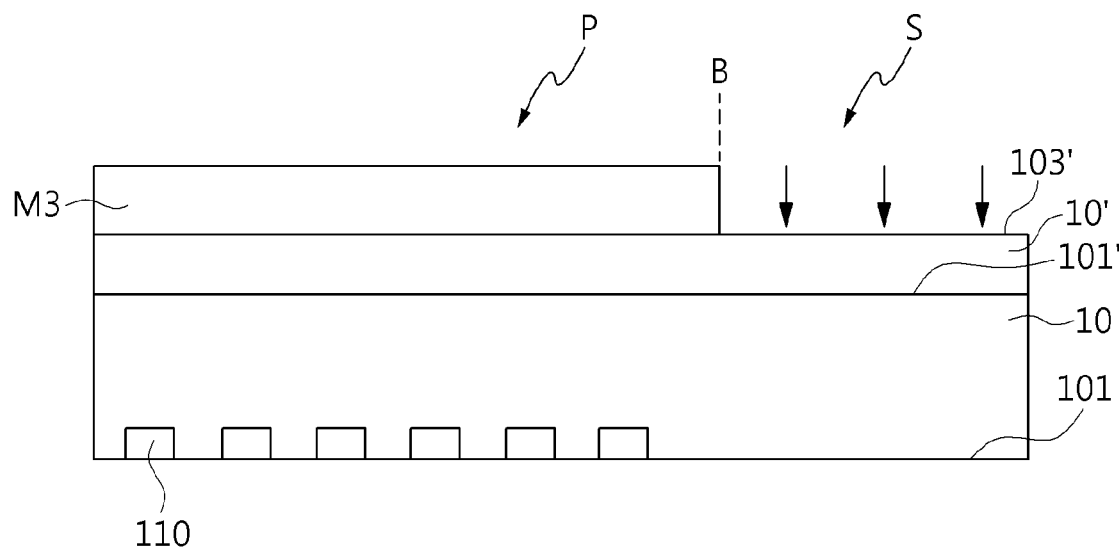
FIGS. 7A and 7B are reference views illustrating intermediate structures formed during an exemplary method of manufacturing a backside illuminated image sensor according to further embodiments of the present invention.
Figure 7B:
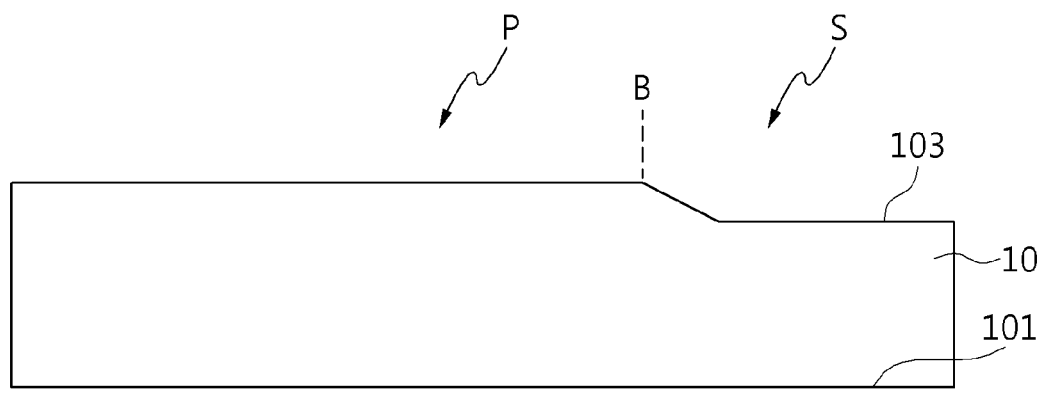

FIGS. 7A and 7B are reference views illustrating structures made in an exemplary method of manufacturing a backside illuminated image sensor according to still further embodiments of the present invention.

According to the method of manufacturing a backside illuminated image sensor according to embodiments of the present invention described with regard to FIGS. 7A-B, there are differences from the above-mentioned embodiments in that the step of implanting impurities is not performed. Specifically, the wafer bonding process for joining the first substrate 10 and the second substrate 10' is performed. On the first substrate 10, the conversion elements 110 are also formed (e.g., prior to wafer-bonding).

Thereafter, as shown in FIG. 7A, on the second substrate 10', a PR mask pattern M3 is formed on the upper surface of the lowermost or back surface 103' in the pixel region P. Then, a dry etching process is performed on the lowermost or back surface 103' of the second substrate 10' in the exposed surrounding region S.

Thereafter, the photoresist mask pattern M3 is removed (e.g., by ashing and cleaning the lamination 20, the light shielding metal layer 30a-b, and the upper insulating layer are sequentially deposited on the uppermost or back surface of the first substrate 10, and then the color filter 50, the planarization layer PL 60, and the lenses 70 are formed.

The foregoing detailed description illustrates the present invention. In addition, the foregoing is intended to illustrate and explain various embodiments of the present invention, and the present invention may be used in various other combinations, modifications, and environments. That is, it is possible to change or modify the scope of the invention disclosed in this specification, the scope of disclosure, and the equivalent scope and/or the skill or knowledge of the present invention. The above-described embodiments illustrate the best mode for carrying out the technical idea of the present invention, and various modifications can be made in specific applications and uses of the present invention. Therefore, the detailed description is not intended to limit the invention to the disclosed embodiments.

What is claimed is:

1. A backside illuminated image sensor, comprising:
a substrate having a lowermost or front surface, an uppermost or back surface, and a plurality of conversion elements therein;
lamination comprising one or more layers on the uppermost or back surface of the substrate;
a light shielding metal layer on the lamination configured to shield incident light from one or more of a plurality of lenses;
a color filter on the lamination in a pixel region, the pixel region comprising a plurality of unit pixels; and
the plurality of lenses on the color filter, configured to focus incident light on the conversion element in a corresponding pixel,
wherein the uppermost or back surface of the substrate has a height difference between the pixel region and a surrounding region, and the pixel region and the surrounding region have a boundary therebetween.

2. The sensor of claim 1, wherein the uppermost or back surface of the substrate includes:
a first flat portion in the pixel region, having a first height; and
a step having a second height different from the first height, at the boundary and in the surrounding region, wherein the step includes a declined portion that declines from the boundary to the surrounding region.

3. The sensor of claim 1, wherein the lamination and the light shielding metal layer have a substantially constant thickness in the pixel region and the surrounding region.

4. The sensor of claim 1, wherein the light shielding metal layer includes:
a first, planar light shielding portion having a rectangular frame, lattice and/or pattern in the pixel region; and
a second light shielding portion having a rectangular lattice or pattern or a plate shape in the surrounding region, wherein a difference in patterning density exists between the pixel region and the surrounding region.

5. The sensor of claim 1, wherein the uppermost or back surface of the substrate in the pixel region is higher than the uppermost or back surface of the substrate located in the surrounding region.

6. The sensor of claim 1, wherein the lamination layer includes:
a pinning layer on the uppermost or back surface of the substrate, configured to provide a charge accumulation region in or on the uppermost or back surface; and
a first passivation layer on the pinning layer, configured to protect a surface of the substrate.

7. The sensor of claim 6, wherein the lamination and the second light shielding portion in the surrounding region are lower than the lamination and the first light shielding portion in the pixel region.

8. A backside illuminated image sensor, comprising:
a first substrate having a lowermost or front surface, an uppermost or back surface, and a plurality of conversion elements therein;
lamination comprising one or more layers on the uppermost or back surface of the first substrate;
a light shielding metal layer on the lamination, configured to shield incident light from one or more of a plurality of lenses and having a planar shape in a rectangular frame, lattice and/or pattern in a pixel region of the image sensor;
a color filter on the lamination in the pixel region, wherein the pixel region comprises a plurality of unit pixels, and the color filter fills a plurality of filter forming holes in the pixel region; and
the plurality of lenses on the color filter, configured to focus incident light on one of the conversion elements in a corresponding pixel,
wherein the uppermost or back surface of the first substrate has a height difference between the pixel region and the surrounding region, the uppermost surface of the layers on the uppermost or back surface of the substrate in a surrounding region is lower than the uppermost surface of layers other than the plurality of lenses in the pixel region, and a boundary is between the pixel region and the surrounding region.

9. The sensor of claim 8, wherein the light shielding metal layer has a difference in patterning density between the pixel region and the surrounding region.

10. The sensor of claim 8, wherein the uppermost or back surface of the first substrate comprises implanted boron in the surrounding region of the first substrate or a lowermost or back surface of a second substrate bonded to the first substrate that is subsequently removed by wet etching.

11. The sensor of claim 10, wherein a height difference is between the pixel region and the surrounding region having the boundary therebetween by the wet etching process, after B-11 is implanted into the lowermost or front surface of the first substrate or the lowermost or back surface of the second substrate at the surrounding region at a concentration of $1\times10^{17}/cm^3$ or more.

12. The sensor of claim 9, wherein the lamination includes:
a pinning layer on the uppermost or back surface of the first substrate, configured to provide a charge accumulation region in or on the uppermost or back surface of the first substrate; and
a first passivation layer on the pinning layer, configured to protect a surface of the first substrate.

* * * * *